United States Patent
Song et al.

(10) Patent No.: US 8,278,661 B2
(45) Date of Patent: Oct. 2, 2012

(54) THIN FILM TRANSISTOR, DISPLAY DEVICE INCLUDING THE SAME, AND METHOD FOR MANUFACTURING THE SAME

(75) Inventors: Jun-Ho Song, Seongnam-si (KR); Joo-Han Kim, Yongin-si (KR); Hyung-Jun Kim, Seoul (KR); Sung-Haeng Cho, Chungcheongbuk-do (KR); Ki-Hun Jeong, Seoul (KR); Seung-Hwan Shim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1059 days.

(21) Appl. No.: 12/206,327

(22) Filed: Sep. 8, 2008

(65) Prior Publication Data

US 2009/0174690 A1    Jul. 9, 2009

(30) Foreign Application Priority Data

Jan. 4, 2008  (KR) .................. 10-2008-0001369

(51) Int. Cl.
*G06F 3/038* (2006.01)
(52) U.S. Cl. .......... 257/59; 438/128; 438/129; 438/275; 257/390; 257/E27.081; 345/204
(58) Field of Classification Search .............. 257/59, 257/390, E27.081, E22.81; 345/204; 354/204; 438/128, 129, 130, 275, 278, 290
See application file for complete search history.

(56) References Cited

U.S. PATENT DOCUMENTS 7,915,689 B2 *   3/2011   Cho et al. ................... 257/390

\* cited by examiner

*Primary Examiner* — Roy Potter
(74) *Attorney, Agent, or Firm* — Cantor Colburn LLP

(57) ABSTRACT

A display device and a manufacturing method thereof, include a first thin film transistor including a first control electrode, a first semiconductor disposed on the first control electrode, and a first input electrode and a first output electrode opposite to each other on the first semiconductor; and a second thin film transistor including a second control electrode, a second semiconductor disposed on the second control electrode, and a second input electrode and a second output electrode opposite to each other on the second semiconductor, wherein the first semiconductor includes a first lower semiconductor including polysilicon, and a first upper semiconductor disposed on the first lower semiconductor, the first upper semiconductor including amorphous silicon.

21 Claims, 15 Drawing Sheets

THIN FILM TRANSISTOR, DISPLAY DEVICE INCLUDING THE SAME, AND METHOD FOR MANUFACTURING THE SAME

This application claims priority to Korean Patent Application No. 10-2008-0001369, filed on Jan. 4, 2008, and all the benefits accruing therefrom under 35 U.S.C. §119, the contents of which in their entirety are herein incorporated by reference.

BACKGROUND OF THE INVENTION (a) Field of the Invention

The present invention relates to a thin film transistor, a display device including the same and a manufacturing method thereof.

(b) Description of the Related Art

A display device such as a liquid crystal display ("LCD"), an organic light emitting diode ("OLED") display and an electrophoretic display includes a plurality of pixels. Each pixel includes a pair of field generating electrodes and an optical active layer formed therebetween. For example, the LCD includes a liquid crystal capacitor having a liquid crystal layer as the optical active layer between the field generating electrodes, and the OLED display includes an organic light emitting element having an organic emission layer as the optical active layer between the field generating electrodes.

Each display device also includes switching elements, each connected to one of the pair of the field generating electrodes and controlling an electric signal, and the optical active layer converts the electric signal into an optical signal to thereby display images. Here, each switching element receives data signals from data lines according to scanning signals from gate lines and transmits the data signals to pixel electrodes. The switching elements are generally thin film transistors, and hence are switching transistors.

The field generating electrodes, the switching elements, the gate lines and the data lines are formed in at least one of a pair of display panels of the display device.

The display device including the switching elements also includes a gate driver which applies the scanning signals to the gate lines and a data driver which applies the data signals to the data lines. The gate driver and the data driver are also operated according to signals transmitted from a signal controller, and may be formed on the display panel along with the field generating electrodes and the switching elements. These drivers include a plurality of active elements such as thin film transistors.

The OLED display further includes driving transistors as well as switching transistors. The driving transistors flow the current to the organic light emitting elements according to data signals transmitted from the switching transistors.

However, the thin film transistors of the pixels and the thin film transistors of the drivers necessarily have different characteristics, and the switching transistors and the driving transistors require different characteristics in the OLED display. For example, some thin film transistors are required to have a high on/off current ratio ($I_{on}/I_{off}$), and some other thin film transistors are required to have high carrier mobility. However, these characteristics are trade offs with respect to one another such that it is difficult for thin film transistors having the same structure to simultaneously satisfy these characteristics.

To form the various thin film transistors having the different characteristics in one display panel, thin film transistors having different structures may be manufactured through different processes and different apparatuses. However, the manufacturing process is complicated and the cost and time required are remarkably increased for various thin film transistors having different characteristics in one display panel.

BRIEF SUMMARY OF THE INVENTION

Exemplary embodiments of the present invention provide a plurality of thin film transistors having different characteristics through one manufacturing process and one apparatus.

A thin film transistor according to an exemplary embodiment of the present invention includes a control electrode, a first semiconductor disposed on the control electrode and including polysilicon, a second semiconductor disposed on the first semiconductor and including amorphous silicon, and an input electrode and an output electrode disposed on the second semiconductor and opposite to each other.

The width of the first semiconductor may be equal to or less than the width of the control electrode.

The thickness of the first semiconductor may be in the range of about 100 to 700 Å.

The second semiconductor may include a first portion disposed between the input electrode and the output electrode and a second portion disposed under the input electrode or the output electrode, and the first portion may be thinner than the second portion.

The thin film transistor may be disposed in at least one of a gate driver and a data driver.

A display device according to an exemplary embodiment of the present invention includes a first thin film transistor including a first control electrode, a first semiconductor disposed on the first control electrode, and a first input electrode and a first output electrode opposite to each other on the first semiconductor; and a second thin film transistor including a second control electrode, a second semiconductor disposed on the second control electrode, and a second input electrode and a second output electrode opposite to each other on the second semiconductor, wherein the first semiconductor includes a first lower semiconductor including polysilicon, and a first upper semiconductor disposed on the first lower semiconductor and including amorphous silicon.

The width of the first lower semiconductor may be equal to or less than the width of the first control electrode.

The first upper semiconductor may include a first portion disposed between the first input electrode and the first output electrode and a second portion disposed under the first input electrode or the first output electrode, and the first portion may be thinner than the second portion.

The second semiconductor may include a second lower semiconductor overlapping the second control electrode and including amorphous silicon and a second upper semiconductor disposed on the second lower semiconductor and including amorphous silicon, and the width of the second lower semiconductor may be equal to or less than the width of the second control electrode.

The second upper semiconductor may include a third portion disposed between the second input electrode and the second output electrode and a fourth portion disposed under the second input electrode or the second output electrode, and the third portion may be thinner than the fourth portion.

The thickness of the first lower semiconductor and the second lower semiconductor may be in the range of about 100 to 700 Å.

The display device may further include a passivation layer disposed on the first thin film transistor and the second thin film transistor, wherein at least one of the first lower semiconductor and the second lower semiconductor is in contact with the passivation layer.

The first thin film transistor may be disposed in a driving unit, the second thin film transistor may be disposed in a display unit, and the driving unit may include a gate driver connected to a first signal line and a data driver connected to a second signal line intersecting the first signal line, wherein the first signal line and the second signal line are connected to the second thin film transistor.

The display device may further include a first electrode connected to the first thin film transistor, a second electrode facing the first electrode, and an organic emission layer disposed between the first electrode and the second electrode, wherein the first control electrode may be electrically connected to the second output electrode.

A manufacturing method of a display device according to an exemplary embodiment of the present invention includes forming first and second control electrodes, forming a gate insulating layer and a first amorphous silicon layer on the first and second control electrodes, patterning the first amorphous silicon layer to form a first lower semiconductor and a second lower semiconductor respectively overlapping the first and second control electrodes and having a width that is equal to or less than the width of the first and second control electrodes, crystallizing the first lower semiconductor, forming a second amorphous silicon layer and an ohmic contact layer on the first lower semiconductor and the second lower semiconductor, patterning the second amorphous silicon layer and the ohmic contact layer to form a first upper semiconductor and a first ohmic contact layer disposed on the first lower semiconductor and a second upper semiconductor and a second ohmic contact layer disposed on the second lower semiconductor, respectively forming a pair of a first input electrode and a first output electrode disposed on the first ohmic contact layer and a pair of a second input electrode and a second output electrode disposed on the second ohmic contact layer, and removing the first and second ohmic contact layers that are exposed between the first input electrode and the first output electrode, and the second input electrode and the second output electrode.

The first lower semiconductor and the second lower semiconductor may be formed through rear exposure using the first control electrode and the second control electrode as a mask.

The first lower semiconductor may be crystallized through irradiating with a laser.

The method may further include treating with hydrogen after crystallizing the first lower semiconductor.

The method may further include, after removing the exposed first and second ohmic contact layers, forming an insulating layer on the first and second input electrodes and the first and second output electrodes, forming first and second conductors respectively connected to the first and second output electrodes on the insulating layer, and annealing under an atmosphere of an inert gas after forming the insulating layer or forming the first and second conductors.

A first thin film transistor may include the first control electrode, the first lower semiconductor, the first upper semiconductor, the first ohmic contact layer, the first input electrode, and the first output electrode, and a second thin film transistor may include the second control electrode, the second lower semiconductor, the second upper semiconductor, the second ohmic contact layer, the second input electrode, and the second output electrode, wherein the first thin film transistor may be disposed in a driving unit and the second thin film transistor may be disposed in a display unit.

The method may further include forming a first electrode connected to the first output electrode, forming an organic emission layer on the first electrode, and forming a second electrode on the organic emission layer.

According to an exemplary embodiment of the present invention, a plurality of thin film transistors that are required to have different characteristics may be formed on one substrate through the same manufacturing method and apparatus.

Also, when crystallizing the semiconductor using the laser, a crack of the semiconductor is not generated at a step portion of the circuit control electrode, and the crystallization may be uniformly executed. Also, the effective energy density is increased and the crystallinity is improved, thereby increasing the charge mobility.

Also, it is not necessary for the thickness of the control electrode to be reduced such that as addition process is not necessary and a sufficient process margin may be obtained, and it is not necessary for the thickness of the gate insulating layer to be thicker such that the mobility current may be increased and sufficient storage capacitance may be gained.

DETAILED DESCRIPTION OF THE INVENTION

Figure 1:
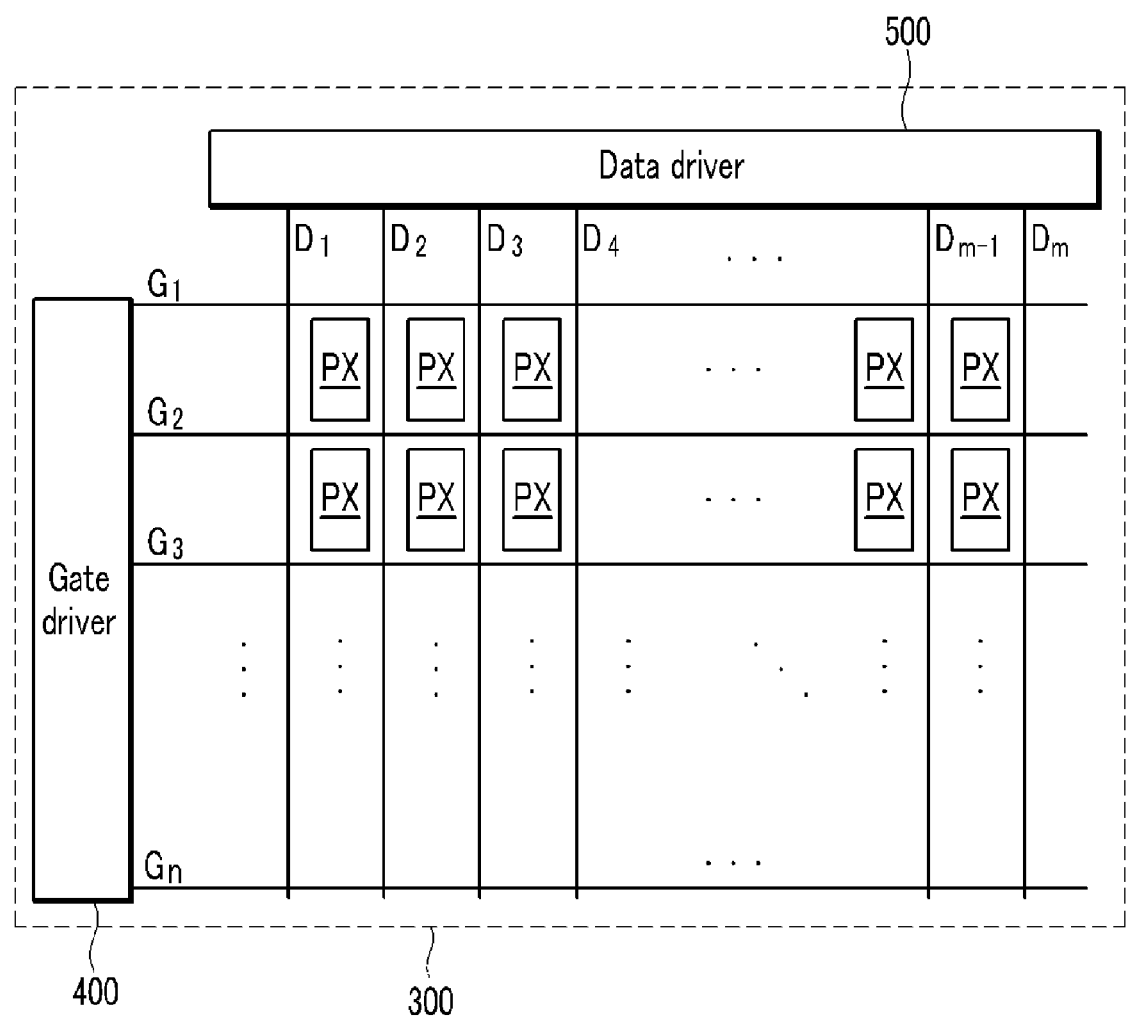
FIG. 1 is a schematic diagram of a display device according to an exemplary embodiment of the present invention.

The present invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Exemplary Embodiment 1

First, a display device according to an exemplary embodiment of the present invention will be described with the reference to FIG. 1.

FIG. 1 is a schematic diagram of a display device according to an exemplary embodiment of the present invention.

Referring to FIG. 1, a display device according to an exemplary embodiment of the present invention includes a display panel unit 300 made of one or two display panels.

The display panel unit 300 includes a plurality of pixels, a plurality of gate lines $G_1$-$G_n$, a plurality of data lines $D_1$-$D_m$, a gate driver 400 and a data driver 500.

The gate lines $G_1$-$G_n$ transmit gate signals, and the data lines $D_1$-$D_m$ transmit data signals and cross the gate lines $G_1$-$G_n$.

The pixels PX are connected to the gate lines $G_1$-$G_n$, and the data lines $D_1$-$D_m$, and are arranged substantially in a matrix. Each pixel PX includes a switching element (not shown) such as a thin film transistor.

The gate driver 400 is connected to the gate lines $G_1$-$G_n$ of the display panel unit 300, and applies gate signals which are formed of a combination of a gate-on voltage Von and a gate-off voltage Voff to the gate lines $G_1$-$G_n$.

The data driver 500 is connected to the data lines $D_1$-$D_m$ of the display panel unit 300 and applies data signals to the data lines $D_1$-$D_m$.

The gate driver 400 and the data driver 500 include a plurality of thin film transistors (not shown) for generating and controlling the gate and data signals.

Next, a liquid crystal display according to an exemplary embodiment of the present invention will be described in more detail with reference to FIG. 2.

Figure 2:
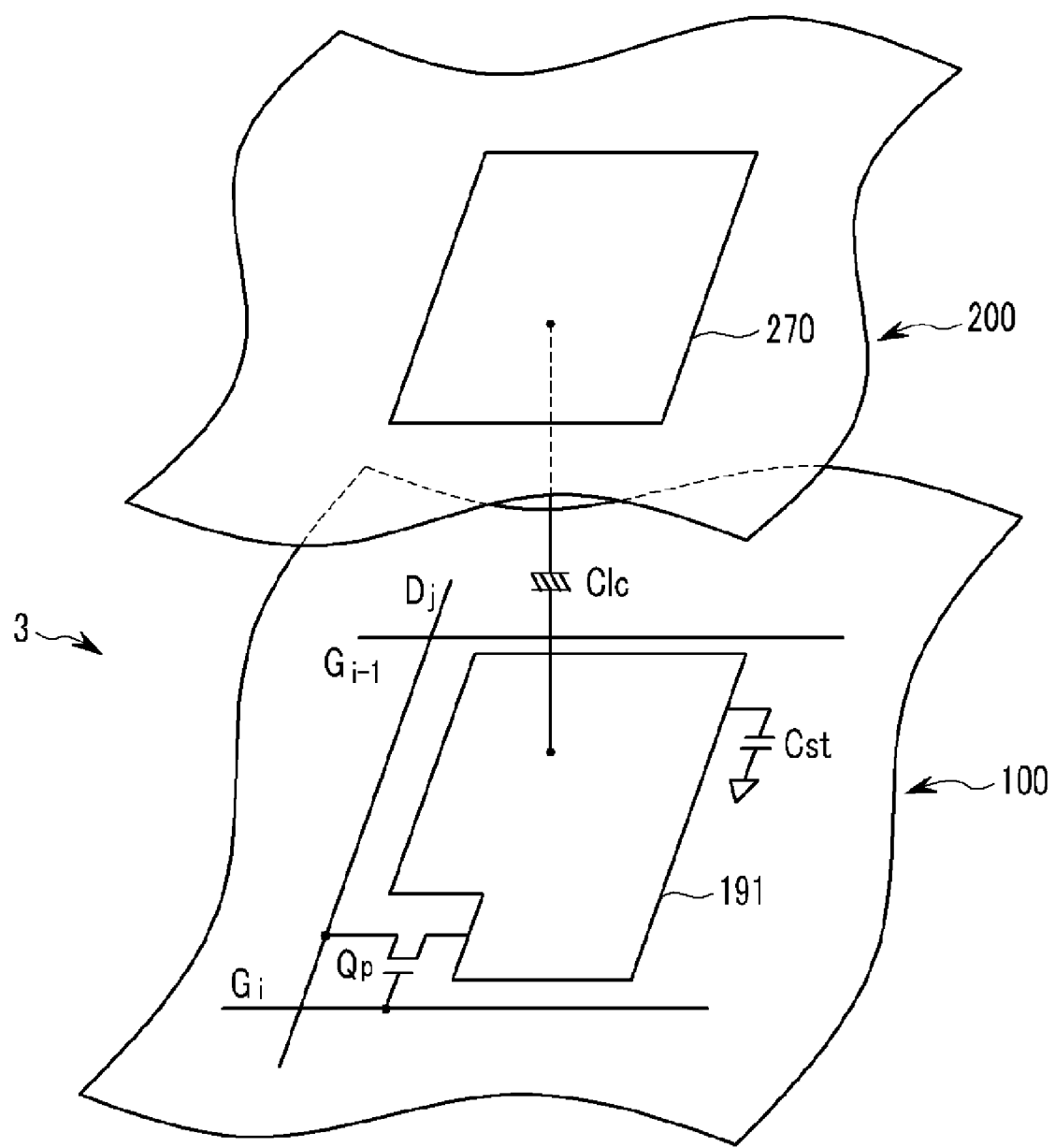
FIG. 2 is an equivalent circuit schematic diagram of one pixel in a liquid crystal display according to an exemplary embodiment of the present invention.

FIG. 2 is an equivalent circuit schematic diagram of one pixel of a liquid crystal display according to an exemplary embodiment of the present invention.

The display panel unit 300 of the liquid crystal display according to the present exemplary embodiment includes a lower panel 100 and an upper panel 200 facing each other, and a liquid crystal layer 3 formed therebetween.

Each pixel PX includes a thin film transistor Qp as a switching element connected to the gate line $G_i$ and the data line $D_j$, and a liquid crystal capacitor Clc and a storage capacitor Cst connected thereto. The storage capacitor Cst may be omitted, if necessary in alternative embodiments.

The switching thin film transistor Qp is three terminal element which is provided in the lower panel 100, and includes a control terminal connected to the gate line $G_i$, an input terminal connected to the data line $D_j$ and an output terminal connected to the liquid crystal capacitor Clc and the storage capacitor Cst.

Next, the structure of the thin film transistors of a pixel unit and a driving unit in the display device according to an exemplary embodiment of the present invention will be described with reference to FIG. 3.

Figure 3:
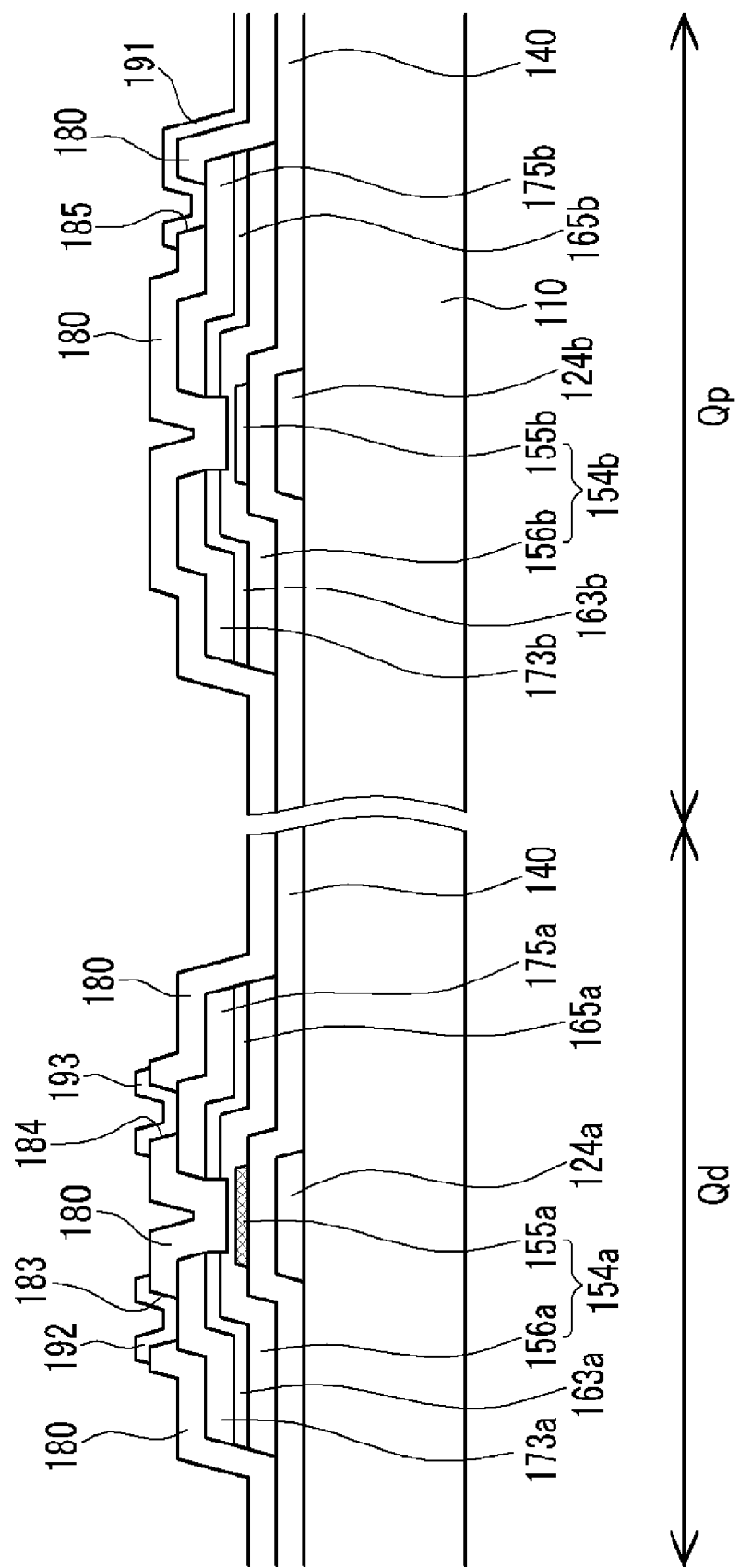
FIG. 3 shows cross-sectional views of structures of thin film transistors Qd and Qp respectively formed in a driving unit and a display unit of the display device according to an exemplary embodiment of the present invention.

FIG. 3 is cross-sectional view showing the structures of thin film transistors Qd and Qp respectively formed in a driver unit and a display unit of the display device according to an exemplary embodiment of the present invention.

Hereafter, to distinguish the thin film transistor Qd of the driving unit and the thin film transistor Qp of the pixel, the thin film transistor Qd of the driving unit is indicated by the term "circuit" and the thin film transistor Qp of the pixel unit is indicated by the term "pixel".

A circuit control electrode 124a and a pixel control electrode 124b are formed on an insulating substrate 110. The pixel control electrode 124b is connected to a gate line (not shown).

A gate insulating layer 140 made of silicon nitride ("SiNx") or silicon oxide ("$SiO_2$") is formed on the circuit control electrode 124a and the pixel control electrode 124b.

A circuit semiconductor 154a and a pixel semiconductor 154b are formed on the gate insulating layer 140.

The circuit semiconductor 154a overlaps the circuit control electrode 124a, and includes a lower circuit semiconductor 155a made of polycrystalline silicon and an upper circuit semiconductor 156a made of hydrogenated amorphous silicon. The polysilicon of the lower circuit semiconductor 155a may be formed by crystallizing amorphous silicon by irradiating a laser thereto.

The pixel semiconductor 154b overlaps the pixel control electrode 124b, and includes a lower pixel semiconductor 155b and an upper pixel semiconductor 156b that are made of hydrogenated amorphous silicon.

Here, the width of the lower circuit semiconductor 155a may be equal to or less than the width of the circuit control electrode 124a, and the width of the lower pixel semiconductor 155b may be equal to or less than the width of the pixel control electrode 124b. The lower circuit semiconductor 155a and the lower pixel semiconductor 155b may be formed through rear exposure using the circuit control electrode 124a and the pixel control electrode 124b as a mask, as is described in the following.

In this way, the lower circuit semiconductor 155a may be prevented from shorting and being crystallized non-uniformly by the circuit control electrode 124a by forming the width of the lower circuit semiconductor 155a to be equal to or less than the width of the circuit control electrode 124a, when irradiating the laser to crystallize the lower circuit semiconductor 155a.

If the width of the lower circuit semiconductor 155a is larger than the width of the circuit control electrode 124a, the lower circuit semiconductor 155a covers the portion where the circuit control electrode 124a is not disposed as well as the upper portion of the circuit control electrode 124a. In this case, when irradiating the laser to the circuit semiconductor 155a, stress is concentrated on the portion which is disposed on the slanted portion defining opposing sides of the circuit control electrode 124a among the circuit semiconductor 155a, such that a crack is generated and the semiconductor may be disconnected. Also, when irradiating the laser to the circuit semiconductor 155a, the thermal conductivities and the heat capacities between the portion where the circuit control electrode 124a is disposed under the circuit semiconductor 155a and the portion where the circuit control electrode 124a is not disposed under the circuit semiconductor 155a become different such that the crystallinity may not be uniform. In this case, the carrier mobility is influenced such that the characteristics of the thin film transistor may be deteriorated.

To solve the disconnection or the non-uniform crystallinity problems, the thickness of the circuit control electrode 124a may be made thinner, but the resistance of the gate line is thereby increased to generate a signal delay. Also, the tapered angle of the circuit control electrode 124a may be decreased to reduce the step of the control electrode, but an additional process for each control electrode may be necessary and the process margin may be reduced. Also, a thick gate insulating layer may be formed to reduce the differences of the thermal conductivities and the heat capacities between the portions where the circuit control electrode 124a is or is not disposed under the circuit semiconductor 155a, but the mobility current may be reduced according to the increase of the thickness of the insulating layer. Also, the storage capacitance of the capacitor formed via the gate insulating layer as a dielectric material may be decreased such that the storage electrode becomes enlarged, thereby reducing the aperture ratio. Accordingly, the above-described methods may basically solve the above-described problems.

In the exemplary embodiment of the present invention, the width of the lower circuit semiconductor 155a is equal to or less than the width of the circuit control electrode 124a such that the lower circuit semiconductor 155a is only disposed on the circuit control electrode 124a and does not exist on the portion where the lower circuit semiconductor 155a is not formed and does not exist on the slant portion defining opposing sides of the circuit control electrode 124a. Accordingly, a crack of the lower circuit semiconductor 155a is not generated on the step portion of the circuit control electrode 124a, and because the lower circuit semiconductor 155a is only disposed on the circuit control electrode 124a, the crystallization may be uniformly executed. Also, when irradiating the laser on the circuit semiconductor 155a, the effective energy density is increased and the crystallinity is improved, thereby increasing the charge mobility. Further, it is not necessary for the thickness of the circuit control electrode 124a to be reduced such that additional processing is not necessary and a sufficient process margin may be obtained. It is also not necessary for the thickness of the gate insulating layer to be thicker such that the mobility current may be increased and sufficient storage capacitance may be gained.

The thickness of the lower circuit semiconductor 155a and the lower pixel semiconductor 155b may be in a range of about 100 Å to about 700 Å. When the thickness is less than 100 Å, the formation of the channel of the thin film transistor may be not completed, and when the thickness is more than 700 Å, the laser beam does not penetrate to the lower portion of the circuit semiconductor 154a when irradiating the laser to crystallize, such that the melting of the silicon and the re-crystallization are not effectively realized and the crystallization of the circuit semiconductor 154a may be not completed and thereby deteriorating the characteristics of the thin film transistor.

A circuit input electrode 173a, a circuit output electrode 175a, a pixel input electrode 173b, and a pixel output electrode 175b are formed on the circuit semiconductor 154a, the pixel semiconductor 154b and the gate insulating layer 140.

The circuit input electrode 173a and the circuit output electrode 175a are disposed on the upper circuit semiconductor 156a and are opposite to each other with a predetermined interval therebetween, and a portion of the upper circuit semiconductor 156a is exposed through the predetermined interval. However, a portion of the lower circuit semiconductor 155a may be exposed, if necessary.

Here, the upper circuit semiconductor 156a includes the first portion disposed between the circuit input electrode 173a and the circuit output electrode 175a and the second portion disposed under the circuit input electrode 173a and the circuit output electrode 175a and respectively overlapping them. The first portion of the upper circuit semiconductor 156a is disposed on the lower circuit semiconductor 155a, and the first portion is thinner than the second portion. However, the first portion of the upper circuit semiconductor 156a may be completely removed. This is due to a back channel etch ("BCE"), as will be described later.

The pixel input electrode 173b and the pixel output electrode 175b are disposed on the upper pixel semiconductor 156b and opposite to each other with a predetermined interval therebetween, and the portion of the upper pixel semiconductor 156b is exposed through the predetermined interval. However, the portion of the lower pixel semiconductor 155b may be exposed, if necessary.

The upper pixel semiconductor 156b includes a third portion disposed between the pixel input electrode 173b and the pixel output electrode 175b, and a fourth portion disposed under the pixel input electrode 173b and the pixel output electrode 175b and respectively overlapping them. The third portion of the upper pixel semiconductor 156b is disposed on the lower pixel semiconductor 155b, and the third portion is thinner than the fourth portion. However, the third portion of the upper pixel semiconductor 156b may be completely removed, if necessary. This is due to the BCE, as will be described later.

Ohmic contacts 163a, 165a, 163b and 165b are formed between the circuit input electrode 173a and the upper circuit semiconductor 156a, the circuit output electrode 175a and the upper circuit semiconductor 156a, the pixel input electrode 173b and the upper pixel semiconductor 156b, and the pixel output electrode 175b and the upper pixel semiconductor 156b, respectively. The ohmic contacts 163a, 165a, 163b and 165b are made of n+ hydrogenated amorphous silicon or n+ crystallized silicon doped with an impurity such as phosphorous at a high concentration, or of silicide.

The ohmic contacts 163a, 165a, 163b and 165b may have substantially the same planer shape as the data line including the pixel input electrode 173b, the pixel output electrode 175b, the circuit input electrode 173a, and the circuit output electrode 175a.

The upper circuit semiconductor 156a may have substantially the same planer shape as the circuit input electrode 173a and the circuit output electrode 175a except for the portion between the circuit input electrode 173a and the circuit output electrode 175a, and the upper pixel semiconductor 156b may have substantially the same planer shape as the pixel input electrode 173b and the pixel output electrode 175b except for between the pixel input electrode 173b and the pixel output electrode 175b.

A passivation layer 180 is formed on the circuit input electrode 173a, the circuit output electrode 175a, the pixel input electrode 173b and the pixel output electrode 175b.

The passivation layer 180 has a plurality of contact holes 183, 184 and 185 exposing the circuit input electrode 173a, the circuit output electrode 175a and the pixel output electrode 175b, respectively.

Conductors 192 and 193 connected to the circuit input electrode 173a and circuit output electrode 175a through the contact holes 183 and 184, respectively, and a pixel electrode 191 connected to the pixel output electrode 175b through the contact hole 185, are formed on the passivation layer 180.

In this display device, the circuit control electrode 124a, the circuit input electrode 173a and the circuit output electrode 175a form the driving thin film transistor Qd along with the circuit semiconductor 154a. Here, the channel of the thin film transistor Qd of the driving unit is formed in the lower circuit semiconductor 155a made of polysilicon.

In this way, the pixel control electrode 124b, the pixel input electrode 173b and the pixel output electrode 175b form the switching thin film transistor Qp of the pixel along with the pixel semiconductor 154b. Here, the channel of the switching thin film transistor Qp of the pixel is formed in the lower pixel semiconductor 155b made of amorphous silicon.

According to an exemplary embodiment of the present invention, the channel of the driving thin film transistor Qd is formed in the polysilicon and the channel of the pixel thin film transistor Qp of the display unit is formed in the amorphous silicon, such that the channel of the driving thin film transistor Qd of the driving unit and the channel of the pixel thin film transistor Qp of the display unit are formed in semiconductors having different crystallization.

The channel of the driving thin film transistor Qd is formed in the polysilicon such that high carrier mobility and stability may be obtained. Also, although a gate bias and thermal stress are generated by the application of the repeated positive voltage under driving, degradation of the transistor is small such that a threshold voltage Vth is uniformly maintained to thereby prevent image sticking and a reduction of the lifetime of the transistor.

On the other hand, the channel of the thin film transistor Qp in the display unit is formed in the amorphous silicon such that the $I_{on}/I_{off}$ ratio of the on/off current may be increased and the leakage current may be reduced. Accordingly, a reduction of the data voltage may be prevented and cross-talk may be reduced.

In the present exemplary embodiment, one driving thin film transistor Qd and one display thin film transistor Qp are shown for convenience of explanation, but at least one thin film transistor may be further included with respect to both driving and display units.

Now, a method of manufacturing the display device shown in FIG. 3 will be described in further detail with reference to FIGS. 4 to 12.

FIGS. 4 to 12 are cross-sectional views sequentially showing the method of manufacturing the display device shown in FIG. 3 according to an exemplary embodiment of the present invention.

Figure 4:
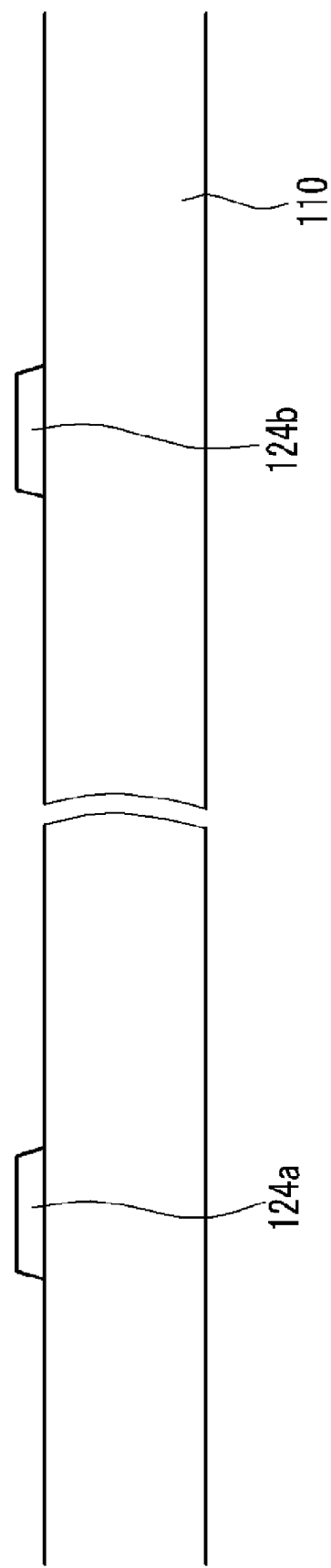
FIGS. 4 to 12 are cross-sectional views sequentially showing a method of manufacturing the display device shown in FIG. 3 according to an exemplary embodiment of the present invention.

Referring to FIG. 4, a gate line (not shown) including a pixel control electrode 124b and a circuit control electrode 124a are formed on an insulating substrate 110.

Figure 5:
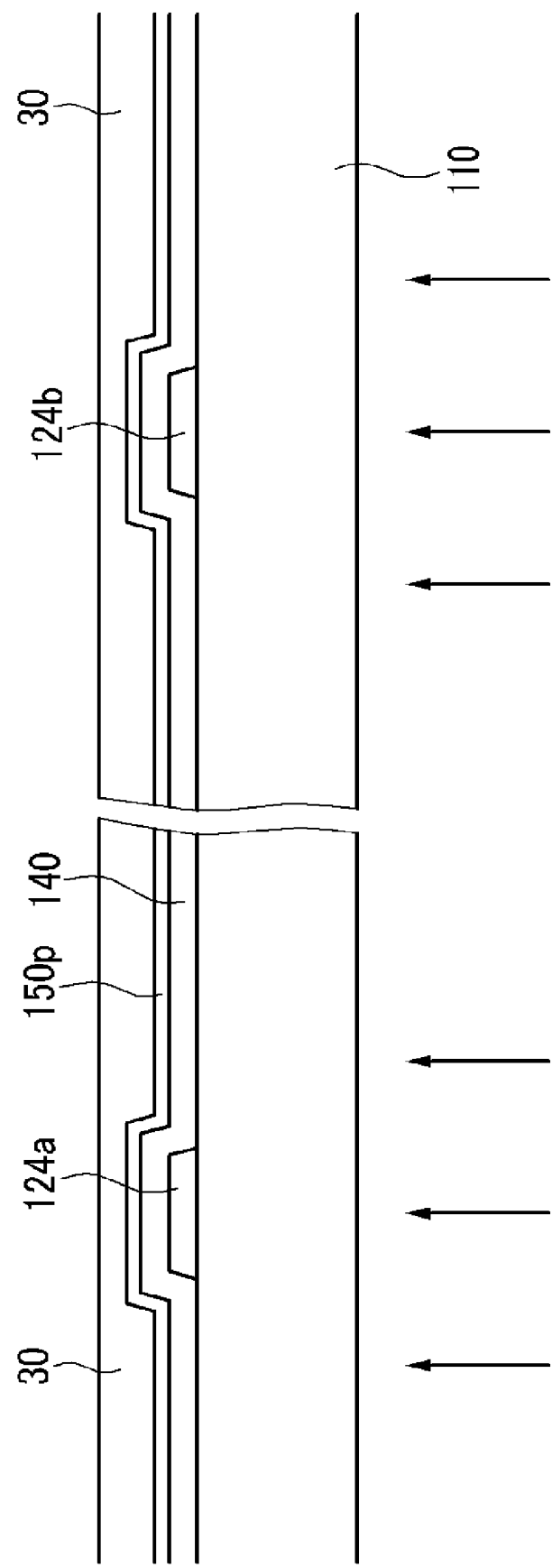

Next, referring to FIG. 5, a gate insulating layer 140 and a lower semiconductor layer 150p are sequentially deposited on the circuit control electrode 124a and the pixel control electrode 124b, and a photosensitive film 30 is coated thereon.

Then, rear exposing in which light is irradiated under the substrate 110 is executed. Here, the rear exposing is executed by using the gate line including the pixel control electrode 124b and the circuit control electrode 124a as a mask. After developing the photosensitive film 30, the lower semiconductor layer 150p is etched by using the photoresist pattern (not shown) as an etch mask to form a lower circuit semiconductor 155a and a lower pixel semiconductor 155b.

Here, the lower circuit semiconductor 155a has substantially the same planer shape as the circuit control electrode 124a, and the width of the lower circuit semiconductor 155a may be equal to or less than the width of the circuit control electrode 124a, considering lateral etching. In this way, the lower pixel semiconductor 155b has substantially the same planer shape as the gate line including the pixel control electrode 124b, and the width of the lower pixel semiconductor 155b may be equal to or less than the width of the gate line including the pixel control electrode 124b, considering lateral etching.

Figure 6:
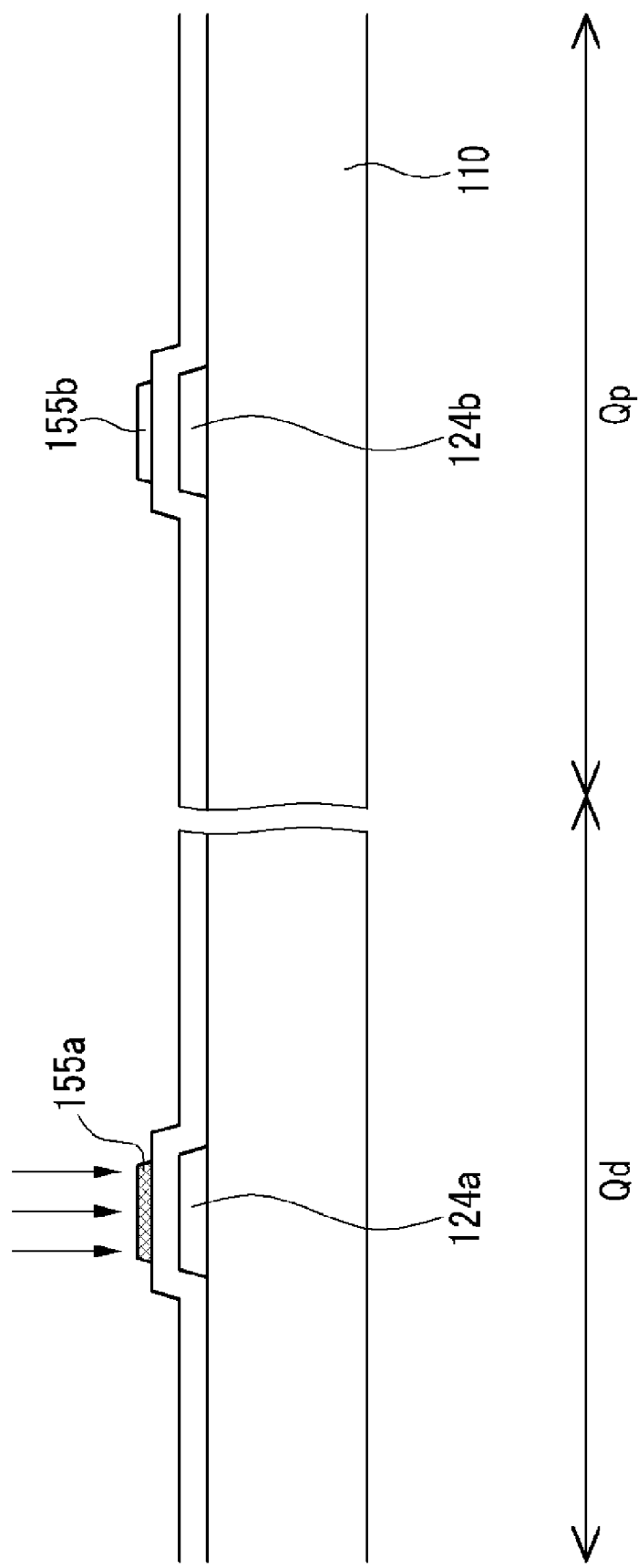

Next, as shown in FIG. 6, a laser is irradiated on the thin film transistor Qd of the driving unit to crystallize the lower circuit semiconductor 155a. Here, the laser is disposed on the substrate and the laser beam is irradiated on the driving unit by a scanning method such that the laser beam is not irradiated on the display unit. The type of laser is not particularly limited, and for example, an excimer laser or a diode pumped solid state laser ("DPSS") of a pulse type with a wavelength of more than about 450 nm may be used.

As above described, the width of the lower circuit semiconductor 155a is equal to or less than the width of the circuit control electrode 124a such that the short of the lower circuit semiconductor 155a and non-uniform crystallization due to the circuit control electrode 124a may be prevented when irradiating the laser on the lower circuit semiconductor 155a.

Next, hydrogen treatment is executed on the whole surface of the substrate 110. The hydrogen treatment may reduce defects which exist on the lower circuit semiconductor 155a.

Figure 7:
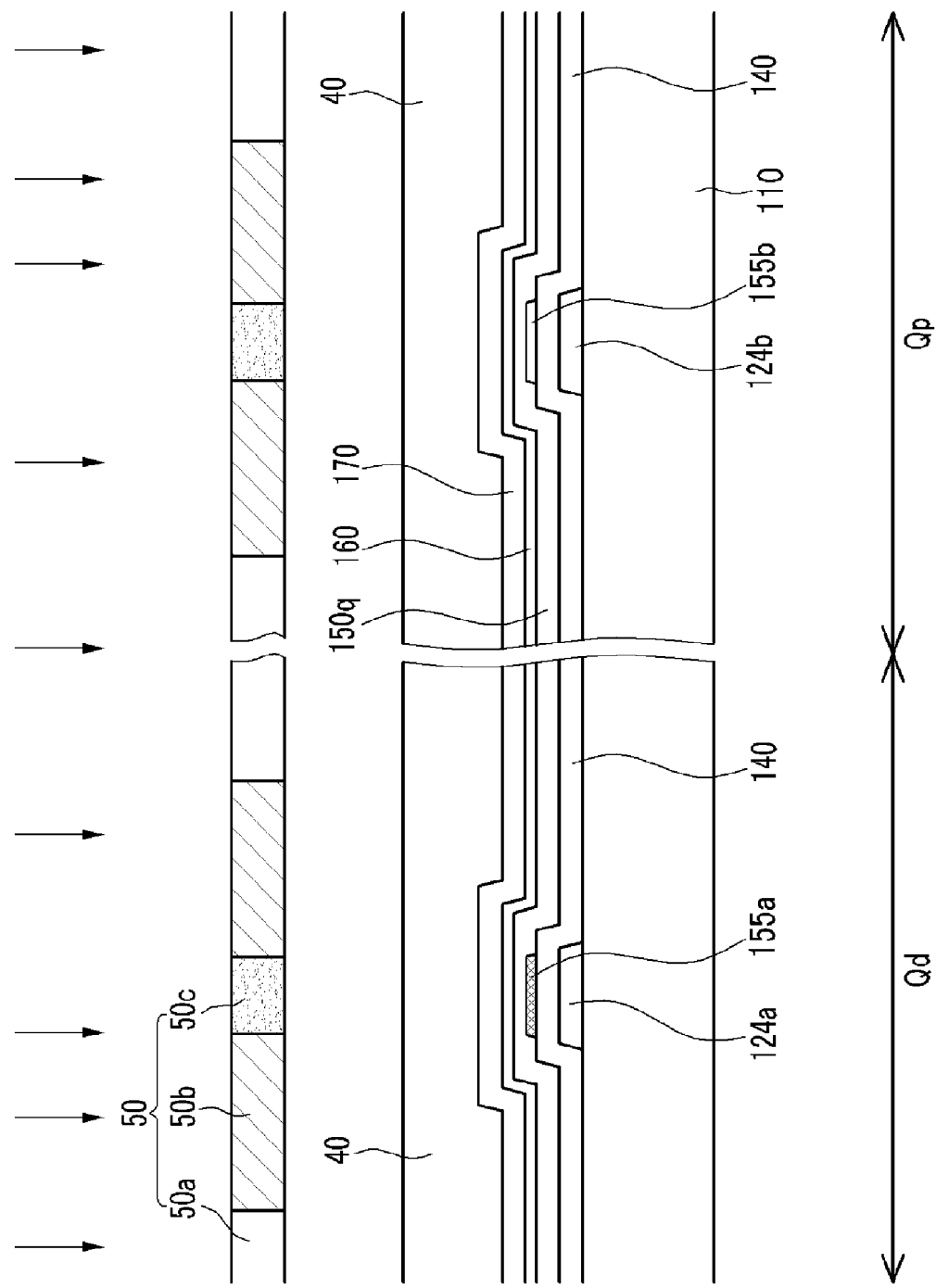

Then, referring to FIG. 7, an upper semiconductor layer 150q, an ohmic contact layer 160 and a conductor layer 170 are sequentially deposited on the lower circuit semiconductor 155a and the lower pixel semiconductor 155b, and a photosensitive film 40 is coated thereon.

Next, a mask 50 is aligned on the photosensitive film 40 and the photosensitive film 40 is exposed by the light. Here, the mask 50 includes a semi-transmissive region 50c as well as a transmissive region 50a and a shielding region 50b therebetween. The semi-transmissive region 50c may include a slit pattern or a lattice pattern, or is a thin film having a middle transmittance or a middle thickness. When using the slit pattern, the width of the slit and the interval between the slits may be less than the resolution of a light exposer used in the photo process.

Figure 8:
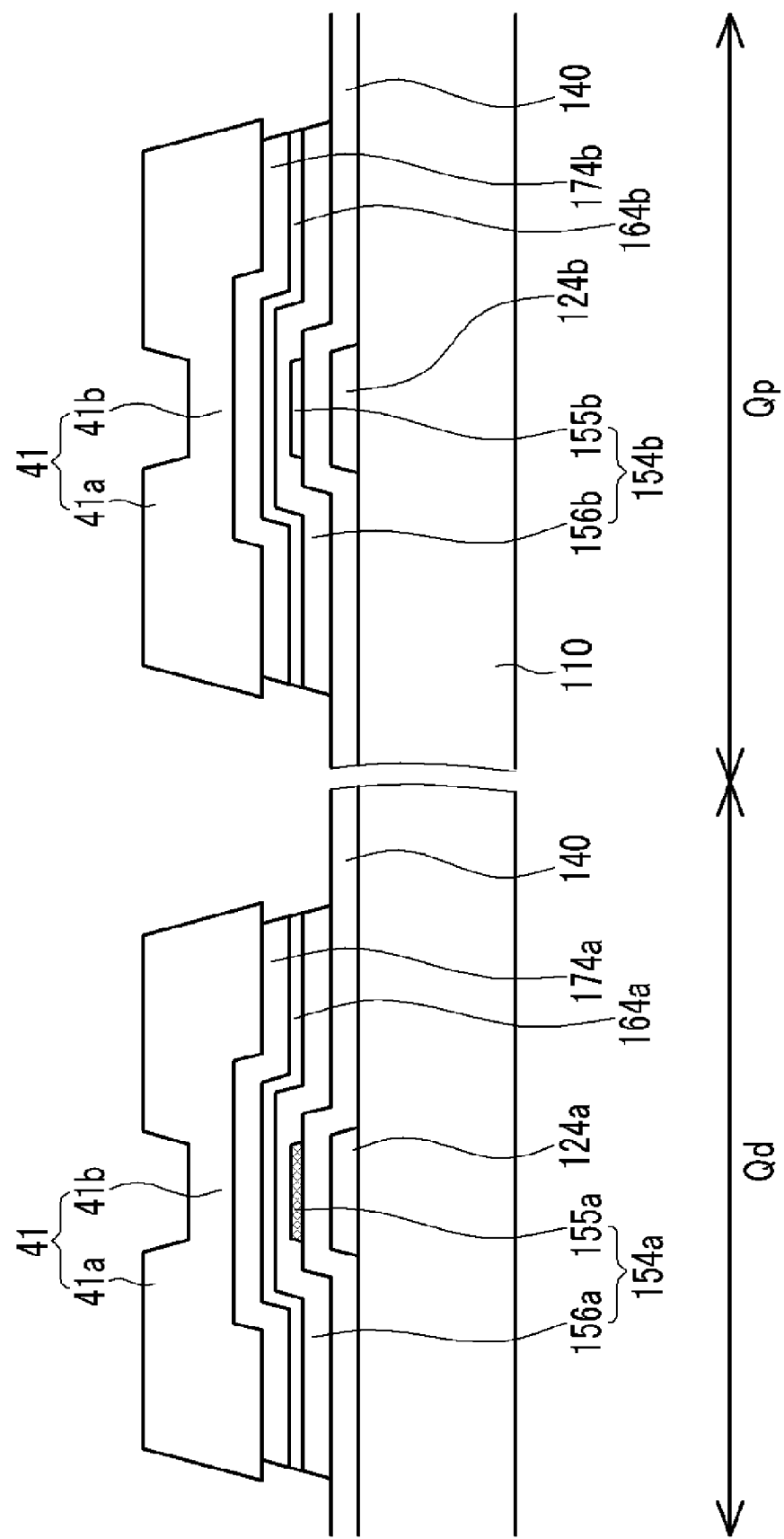

Next, referring to FIG. 8, the mask 50 is removed and the exposed photosensitive film 40 is developed to form a plurality of photoresist patterns 41 having a first photoresist pattern 41a and a second photoresist pattern 41b having a thinner thickness than the first photoresist pattern 41a. The first photoresist pattern 41a is disposed on the portion where a data line including a pixel input electrode 173b, a pixel output electrode 175b, a circuit input electrode 173a and a circuit output electrode 175a will be formed, and the second photoresist pattern 41b is disposed between the portions where a pixel input electrode 173b and a pixel output electrode 175b will be formed and a circuit input electrode 173a and a circuit output electrode 175a may be formed.

The ratio between the thicknesses of first photoresist pattern 41a and the second photoresist pattern 41b may be changed according to process conditions, but the thickness of the second photoresist pattern 41b may be less than half the thickness of the first photoresist pattern 41a.

Next, the conductive layer 170, the ohmic contact layer 160, and the upper semiconductor layer 150q are sequentially etched by using the first and second photoresist patterns 41a and 41b as an etch mask to form a plurality of conductive patterns 174a and 174b, a plurality of ohmic contact patterns 164a and 164b, an upper circuit semiconductor 156a and an upper pixel semiconductor 156b. Here, the portion which is not covered by the first and second photoresist patterns 41a and 41b among the lower circuit semiconductor 155a and the lower pixel semiconductor 155b is etched together.

Figure 9:
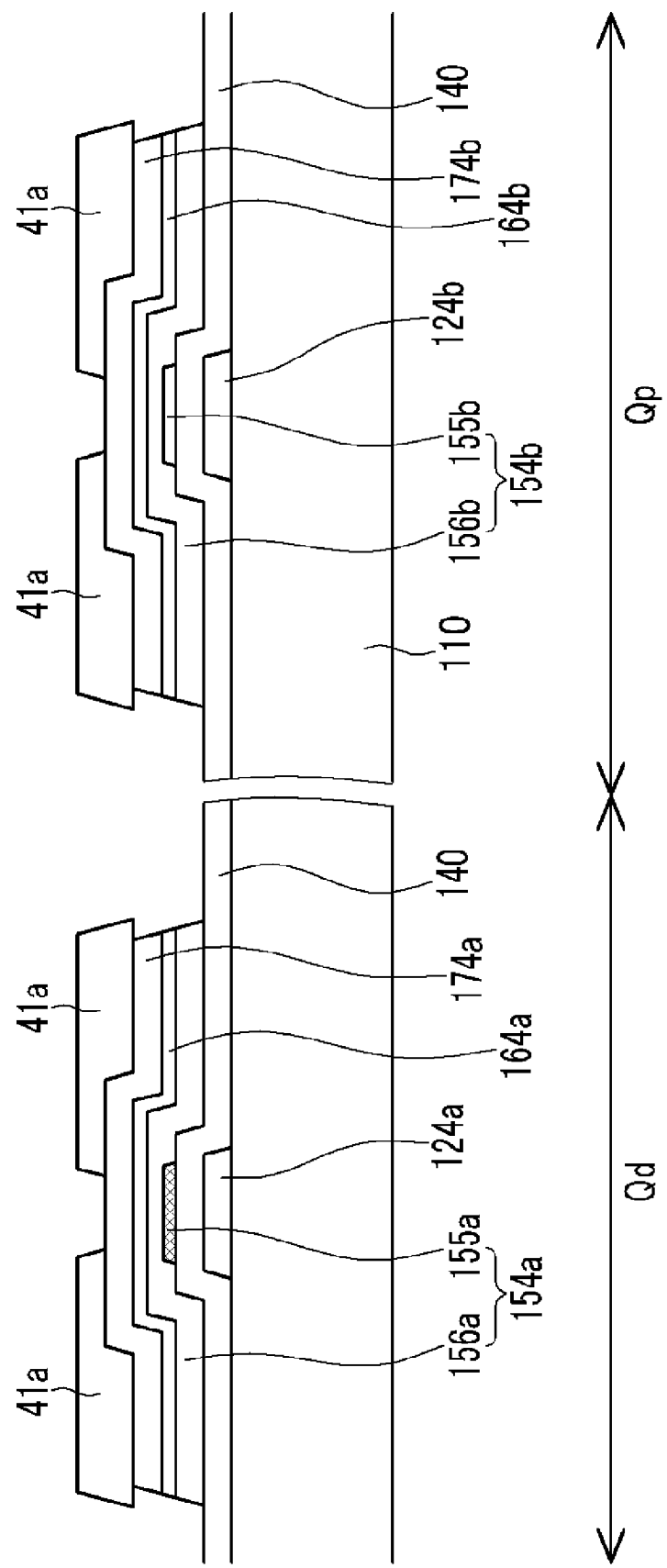

Referring to FIG. 9, an etch-back process such as ashing is then executed to remove the second photoresist pattern 41b. Here, the thickness of the first photoresist pattern 41a is reduced, relative to that illustrated in FIG. 8.

Figure 10:
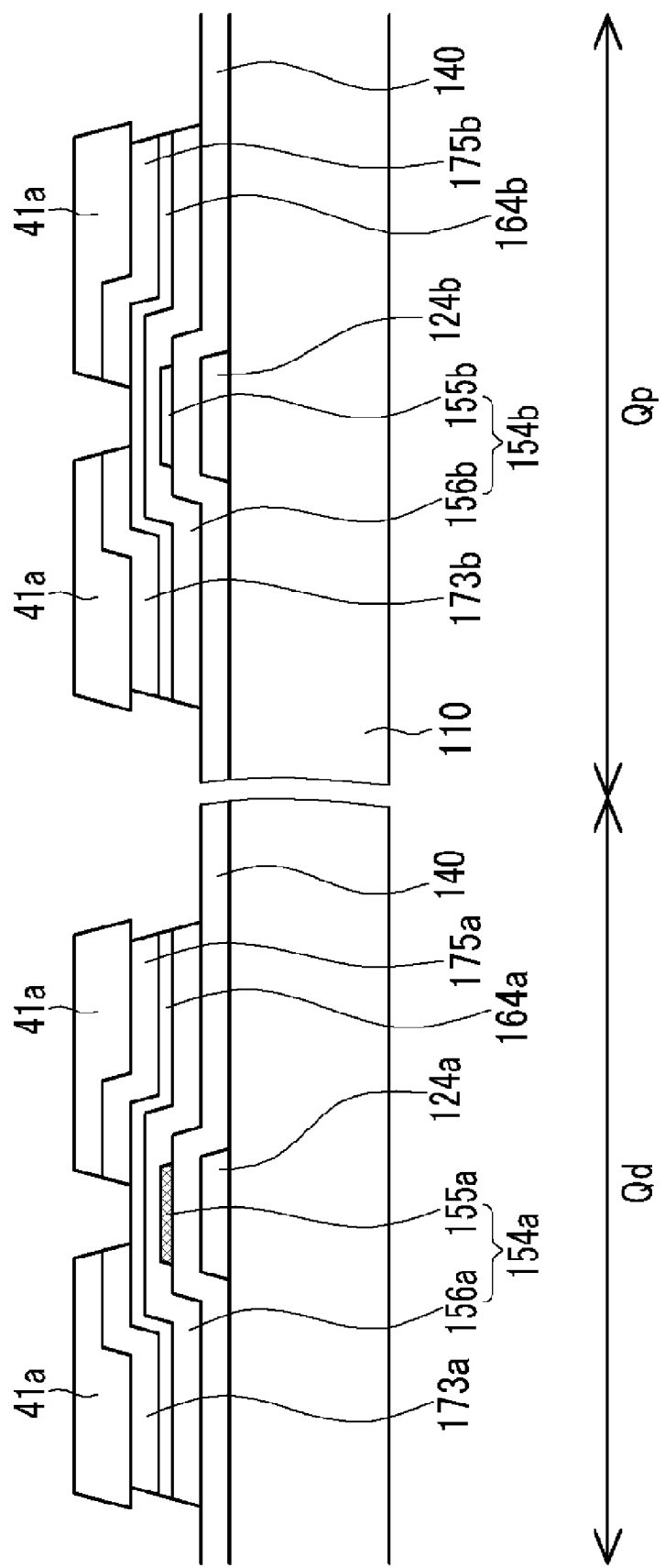

Then, referring to FIG. 10, the conductive patterns 174a and 174b are etched using the first photoresist pattern 41a as an etch mask to form a circuit input electrode 173a, a circuit output electrode 175a, a pixel input electrode 173b and a pixel output electrode 175b. The ohmic contact pattern 164a disposed between the circuit input electrode 173a and the circuit output electrode 175a and the ohmic contact pattern 164b disposed between the pixel input electrode 173b and the pixel output electrode 175b are exposed.

Figure 11:
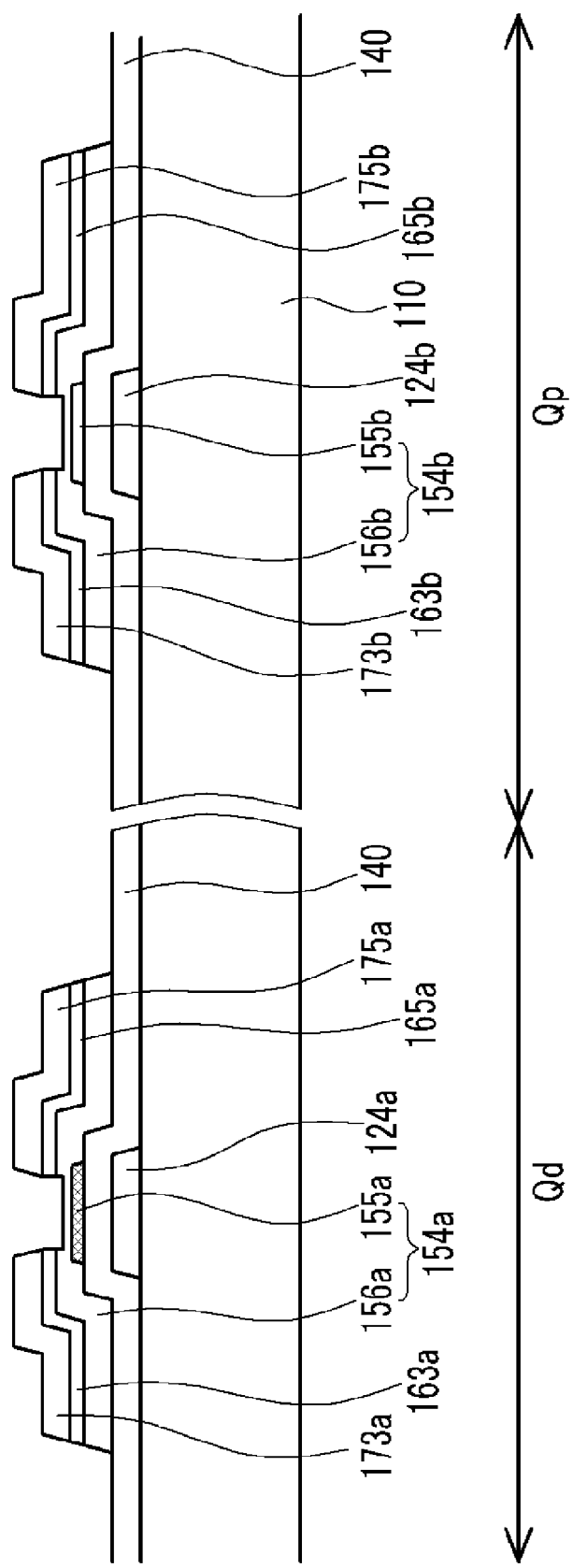

Next, as shown in FIGS. 10 and 11, the exposed portions of the ohmic contact patterns 164a and 164b are dry-etched to respectively form ohmic contacts 163a, 165a, 163b and 165b, and to expose the upper circuit semiconductor 156a and the upper pixel semiconductor 156b disposed thereunder. Here, the portions of the upper circuit semiconductor 156a and the upper pixel semiconductor 156b disposed under the ohmic contact patterns 164a and 164b may be etched such that the thickness of the exposed portions of the upper circuit semiconductor 156a and the upper pixel semiconductor 156b may be decreased. This is referred to as a back channel etch ("BCE").

Figure 12:
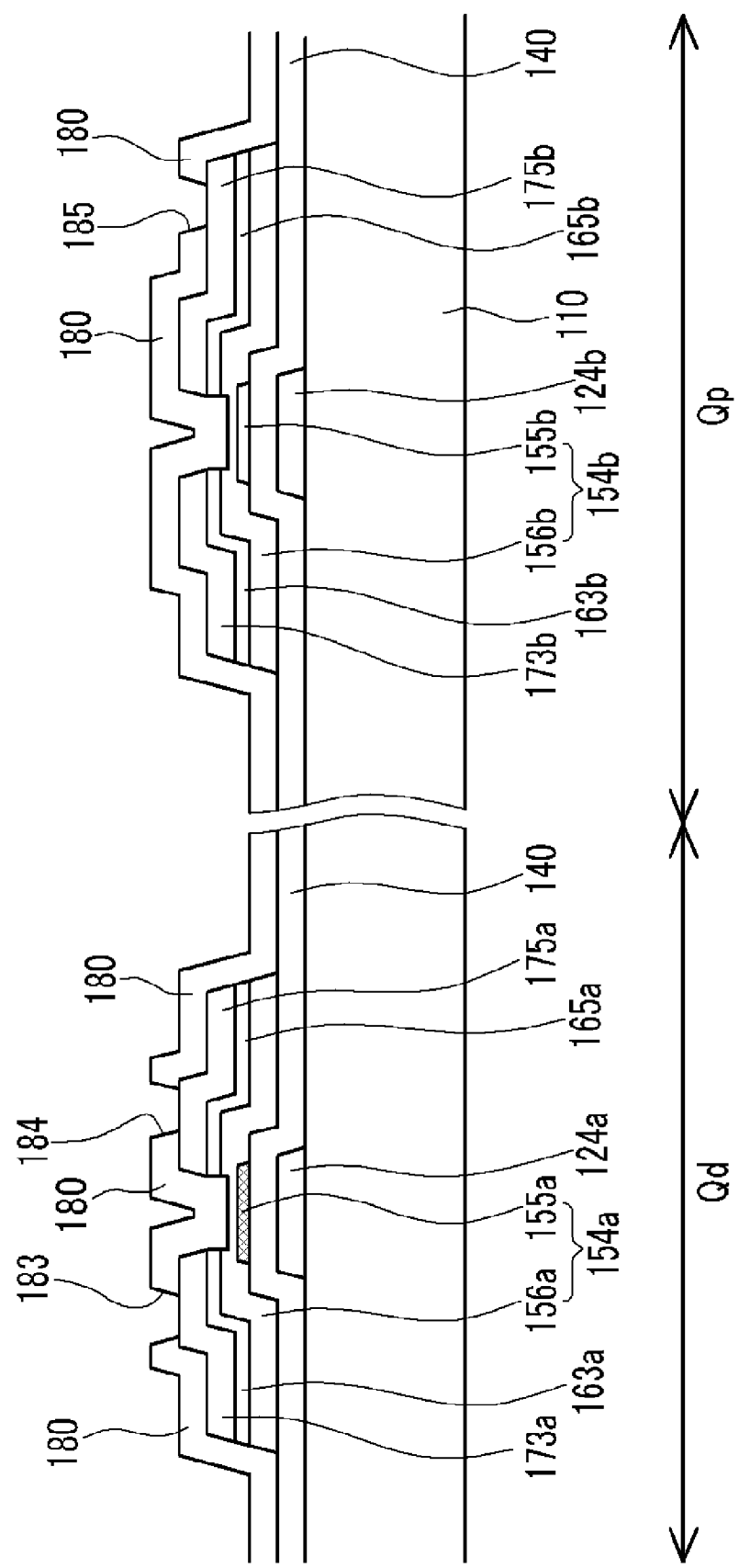

Referring to FIG. 12, a passivation layer 180 is formed on the entire substrate 110 and patterned by photolithography to form a plurality of contact holes 183, 184 and 185 exposing the circuit input electrode 173a, the circuit output electrode 175a and the pixel output electrode 175b, respectively.

Next, referring again to FIG. 3, a conductive layer is formed on the passivation layer 180 and patterned by photolithography to form conductors 192 and 193 which are connected to the circuit input electrode 173a and the circuit output electrode 175a through the contact holes 183 and 184 and a pixel electrode 191 which is connected to the pixel output electrode 175b through the contact hole 185.

Here, the substrate may be annealed after forming the passivation layer 180 or forming the conductors 192 and 193 and the pixel electrode 191. The annealing may be executed under a nitrogen atmosphere at a temperature of about 300° C. In the annealing, the silicon of the circuit semiconductor 154a and the pixel semiconductor 154b is rearranged such that defects which exist between the silicon bondings are reduced, thereby reducing the leakage current.

According to an exemplary embodiment of the present invention, the driving thin film transistor and the display thin film transistor which are required to have different characteristics may be formed on one substrate through the same manufacturing method and apparatus. Accordingly, the gate driver and the data driver including the driving thin film transistor may be directly integrated on the substrate such that the manufacturing cost of the display device may be reduced.

A method using four masks to form the semiconductor layer and forming the data line with one mask was described in the present exemplary embodiment, but it is not limited thereto, and the present invention may be adapted to a method using five masks to form the semiconductor layer and forming the data line with a separate mask or a method using three masks to form the passivation layer and forming the pixel electrode with one mask. In addition, it is noted that a liquid crystal display was described in the previous exemplary embodiment of the present exemplary embodiment, but it is not limited thereto, and the present invention may be adapted to a display device including a driving unit and a display unit such as an OLED display or an electrophoretic display.

Exemplary Embodiment 2

Next, another exemplary embodiment of the present invention will be described with reference to FIGS. 13 to 15. The present exemplary embodiment relates to an active matrix OLED display. Descriptions overlapping the previous exemplary embodiment are omitted, and the same constituent elements are indicated by the same reference numerals.

Figure 13:
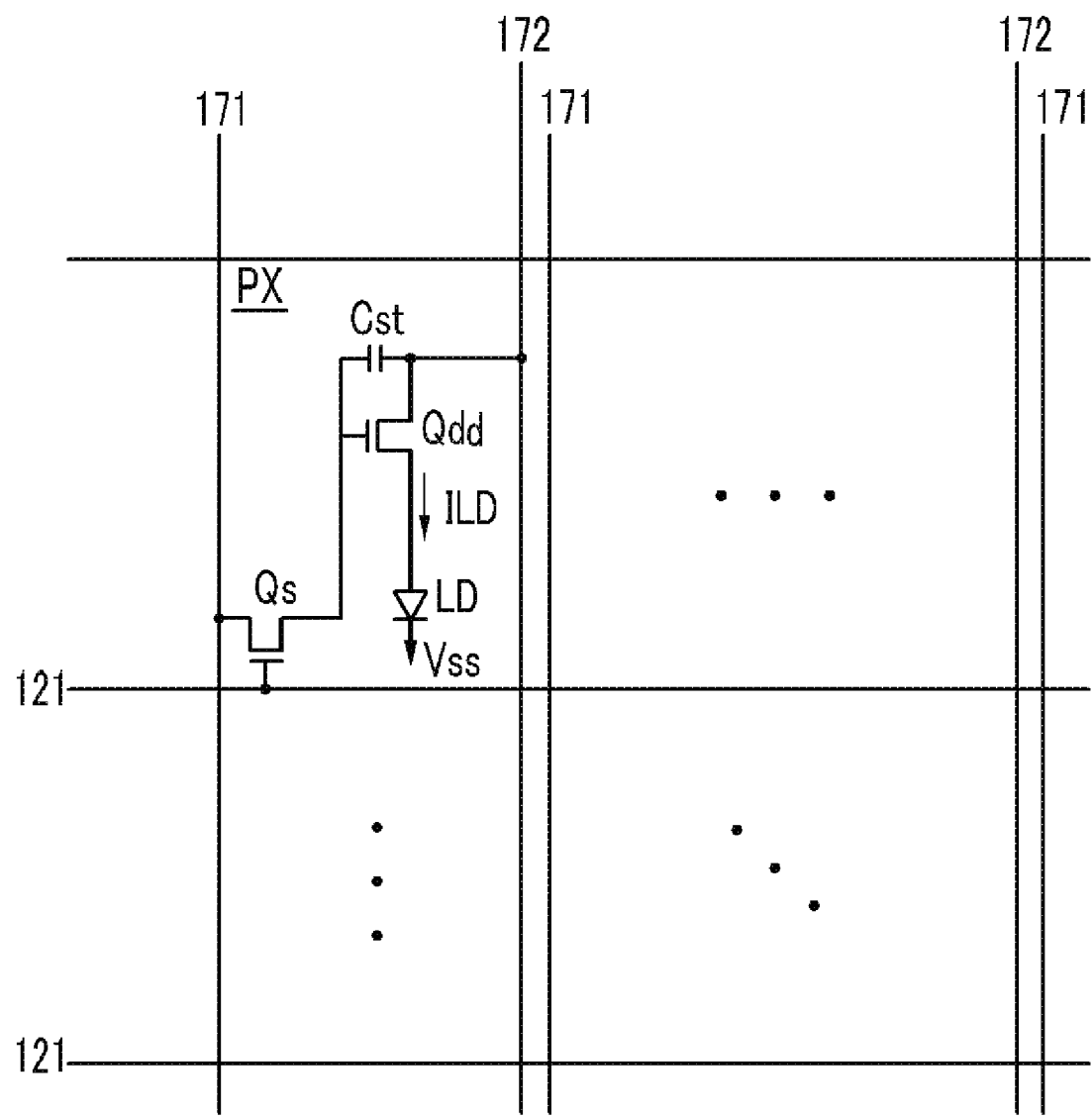
FIG. 13 is an equivalent circuit schematic diagram of an OLED display according to another exemplary embodiment of the present invention.

FIG. 13 is an equivalent circuit schematic diagram of an OLED display according to an exemplary embodiment of the present invention.

Referring to FIG. 13, an OLED display according to the present exemplary embodiment includes a plurality of signal lines 121, 171 and 172, and a plurality of pixels PX connected thereto and substantially arranged in a matrix.

The signal lines include a plurality of gate signal lines 121 for transmitting gate signals (or scanning signals), a plurality of data signal lines 171 for transmitting data signals and a plurality of driving voltage lines 172 for transmitting a driving voltage. The gate signal lines 121 extend substantially in a row direction and substantially parallel to each other, and the data lines 171 and the driving voltage lines 172 extend substantially in a column direction and substantially parallel to each other, as illustrated in FIG. 13.

Each pixel PX includes a switching transistor Qs, a driving transistor Qdd, a storage capacitor Cst and an organic light emitting diode ("OLED") LD.

The switching transistor Qs has a control terminal connected to one of the gate lines 121, an input terminal connected to one of the data lines 171, and an output terminal connected to the driving transistor Qdd. The switching transistor Qs transmits the data signals applied to the data line 171 to the driving transistor Qdd in response to a gate signal applied to the gate line 121.

The driving transistor Qdd has a control terminal connected to the switching transistor Qs, an input terminal connected to the driving voltage line 172, and an output terminal connected to the organic light emitting diode LD. The driving transistor Qdd drives an output current ILD having a magnitude depending on the voltage between the control terminal and the output terminal of the driving transistor Qdd, and outputs output current ILD to the organic light emitting diode LD.

The storage capacitor Cst is connected between the control terminal and the input terminal of the driving transistor Qdd. The storage capacitor Cst stores a data signal applied to the control terminal of the driving transistor Qdd and maintains the data signal after the switching transistor Qs turns off.

The organic light emitting diode LD has an anode connected to the output terminal of the driving transistor Qdd and a cathode connected to a common voltage Vss. The organic light emitting diode LD emits light having an intensity depending on the output current ILD of the driving transistor Qdd, thereby displaying images.

The switching transistor Qs and the driving transistor Qdd are n-channel field effect transistors ("FETs"). However, at least one of the switching transistor Qs and the driving transistor Qdd may be a p-channel FET. In addition, the connections among the transistors Qs and Qdd, the capacitor Cst and the organic light emitting diode LD may be modified in alternative embodiments.

Now, the structure of the OLED display will be described in further detail with reference to FIGS. 14 and 15 along with FIG. 13.

Figure 14:
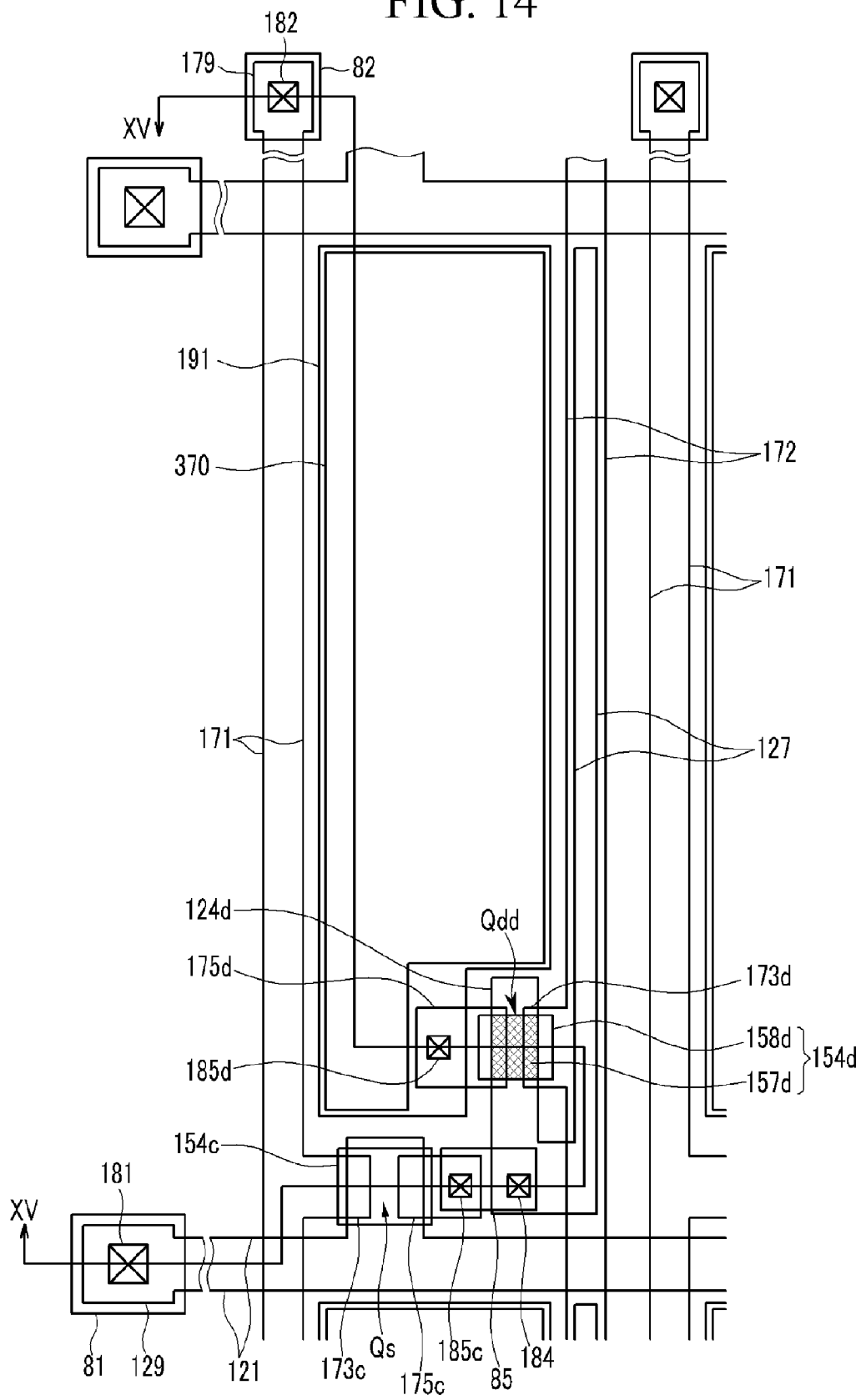
FIG. 14 is a plan view layout of an OLED display according to another exemplary embodiment of the present invention.
Figure 15:
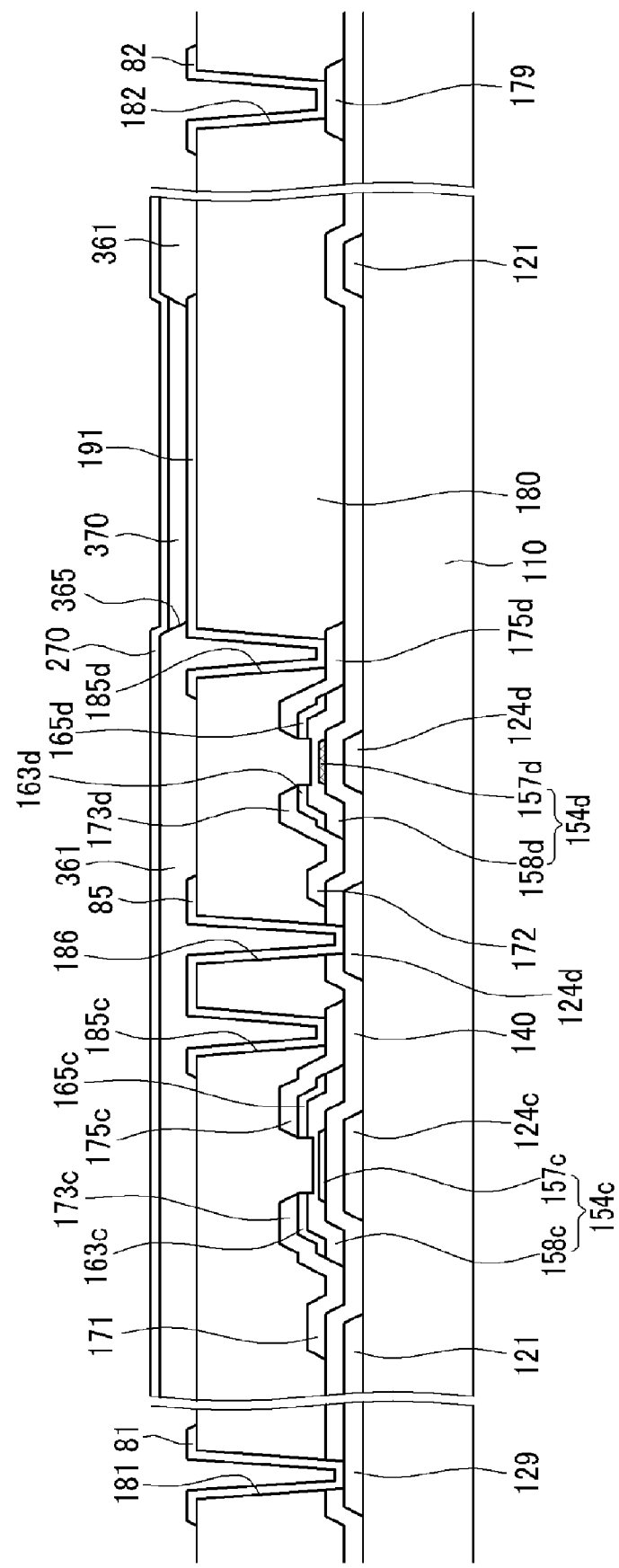
FIG. 15 is a cross-sectional view taken along line XV-XV of the OLED display shown in FIG. 14.

FIG. 14 is a plan view layout of an OLED display according to the current exemplary embodiment of the present invention, and FIG. 15 is a cross-sectional view taken along line XV-XV of the OLED display shown in FIG. 14.

Hereafter, the term "switching" is used for the switching thin film transistor Qs and the term "driving" is used for the driving thin film transistor Qdd.

A plurality of gate lines 121 and a plurality of driving control electrodes 124d are formed on an insulating substrate 110.

The gate lines 121 transmit gate signals and extend substantially in a horizontal direction, as illustrated in FIG. 14. Each gate line 121 includes a plurality of switching control electrodes 124c which protrude upward and an end portion 129 for connection with a different layer or an external driving circuit.

The driving control electrodes 124d are separated from the gate lines 121 and include a plurality of storage electrodes 127 extending in one direction.

A gate insulating layer 140 preferably made of $SIN_x$ or $SiO_2$ is formed on the gate lines 121 and the driving control electrodes 124d.

A switching semiconductor 154c and a driving semiconductor 154d are formed on the gate insulating layer 140.

The switching semiconductor 154c overlaps the switching control electrode 124c, and includes a lower switching semiconductor 157c and an upper switching semiconductor 158c which are made of hydrogenated amorphous silicon.

The driving semiconductor 154d overlaps the driving control electrode 124d, and includes a lower driving semiconductor 157d made of polycrystalline silicon and an upper driving semiconductor 158d made of hydrogenated amorphous silicon. The polycrystalline silicon of the lower driving semiconductor 157d may be formed by crystallizing the amorphous silicon through irradiation of a laser.

Here, the width of the lower switching semiconductor 157c may be equal to or less than the width of the switching control electrode 124c, and the width of the lower driving semiconductor 157d may be equal to or less than the width of the pixel control electrode 124d.

By forming the width of the lower driving semiconductor 157d to be equal to or less than the width of the driving control electrode 124d, the lower driving semiconductor 157d may be prevented from being shorted by the driving control electrode 124d and being non-uniformly crystallized, when irradiating the laser to crystallize the lower driving semiconductor 157d.

The thickness of the lower switching semiconductor 157c and the lower driving semiconductor 157d may be in the range of about 100 Å to about 700 Å.

A pair of ohmic contacts 163c and 165c are formed on the upper switching semiconductor 158c, and a pair of ohmic contacts 163d and 165d are formed on the upper driving semiconductor 158d.

A plurality of data lines 171, a plurality of driving voltage lines 172, a plurality of switching output electrodes 175c, and a plurality of driving output electrodes 175d are formed on the ohmic contacts 163c, 163c, 165d and 165d, and the gate insulating layer 140.

The data lines 171 transmit data signals and extend in a vertical direction while intersecting the gate lines 121, as illustrated in FIG. 14. Each of the data lines 171 includes a plurality of switching input electrodes 173c extending toward the switching control electrode 124c and an end portion 179 having a large area for contact with another layer or an external driving circuit.

The driving voltage lines 172 transmit driving voltages and extend in a vertical direction while intersecting the gate lines 121, as illustrated in FIG. 14. Each driving voltage line 172 includes a plurality of driving input electrodes 173d extending toward the driving control electrode 124d and the portion overlapped with the storage electrodes 127.

The switching and driving output electrodes 175c and 175d are separated from each other, and are separated from the data lines 171 and the driving voltage lines 172.

The switching input electrode 173c and the switching output electrode 175c are opposite to each other on the upper switching semiconductor 158c with a predetermined interval therebetween, and a portion of the upper switching semiconductor 158c is exposed therebetween. However, a portion of the lower switching semiconductor 157c may be exposed, if necessary.

The upper switching semiconductor 158c includes the first portion disposed between the switching input electrode 173c and the switching output electrode 175c and the second portion overlapping the switching input electrode 173c and the switching output electrode 175c and disposed thereunder, and the first portion is thinner than the second portion. However, the first portion of the upper switching semiconductor 158c may be completely removed in alternative embodiments. This is due to the BCE.

The driving input electrode 173d and the driving output electrode 175d are opposite to each other on the upper driving semiconductor 158d with a predetermined interval therebetween, and a portion of the upper driving semiconductor 158d is exposed therebetween. However, a portion of the lower driving semiconductor 157d may be exposed.

The upper driving semiconductor 158d includes a third portion disposed between the driving input electrode 173d and the driving output electrode 175d and a fourth portion respectively overlapping the driving input electrode 173d and the driving output electrode 175d, and the third portion is thinner than the fourth portion. However, the third portion of the upper driving semiconductor 158d may be completely removed. This is due to the BCE.

A passivation layer 180 is formed on the data lines 171 including the switching input electrode 173c, the switching output electrode 175c, the driving input electrode 173d, and the driving voltage line 172 including the driving output electrode 175d. The passivation layer 180 has a plurality of contact holes 182, 185c and 185d exposing the end portions 179 of the data lines 171 and the switching and driving output electrodes 175c and 175d, respectively. The passivation layer 180 and the gate insulating layer 140 have a plurality of contact holes 181 and 186 exposing the end portions 129 of the gate line 121 and the driving control electrodes 124d, respectively.

A plurality of pixel electrodes 191, a plurality of connecting members 85 and a plurality of contact assistants 81 and 82 are formed on the passivation layer 180.

The pixel electrodes 191 are physically and electrically connected to the driving output electrode 175d through the contact holes 185d. The connecting member 85 is connected to the driving control electrode 124d and the switching output electrode 175c through the contact holes 186 and 185c, respectively.

The contact assistants 81 and 82 are connected to the end portions 121 and 171 of the gate lines 121 and the data lines 171 through the contact holes 181 and 182, respectively. The contact assistants 81 and 82 enhance the adhesion between the end portions 129 and 179 of the gate lines 121 and the data lines 171, and an external device, as well as to protect them.

An insulating layer 361 is formed on the passivation layer 180 and the pixel electrode 191. The insulating layer 361 has an opening 365 enclosing the edge of the pixel electrode 191.

An organic light emitting member 370 is formed in the opening 365. The organic light emitting member 370 may include an auxiliary layer (not shown) for improving light emitting efficiency, as well as light emission layers.

A common electrode 270 is formed on the organic light emitting member 370.

An encapsulation layer (not shown) may be formed on the common electrode 270. The encapsulation layer encapsulates the organic light emitting member 370 and the common electrode 270 to prevent moisture and/or oxygen from penetrating from the outside.

In this OLED display, the switching control electrode 124c connected to the gate line 121, the switching input electrode 173c connected to the data line 171, and the switching output electrode 175c form the switching thin film transistor Qs along with the switching semiconductor 154c. The channel of the switching thin film transistor Qs is formed in the lower switching semiconductor 157c made of amorphous silicon.

In this way, the driving control electrode 124d connected to the switching output electrode 175c, the driving input electrode 173d connected to the driving voltage line 172, and the driving output electrode 175d connected to the pixel electrode 191 form the driving thin film transistor Qdd along with the driving semiconductor 154d. The channel of the driving thin film transistor Qdd is formed in the lower driving semiconductor 157d made of polycrystalline silicon.

The pixel electrodes 191, the organic light emitting member 370 and the common electrode 270 form organic light emitting diodes LD, wherein the pixel electrodes 191 are anodes and the common electrode 270 is a cathode, or where the pixel electrodes 191 are cathodes and the common electrode 270 is an anode. Also, the storage electrodes 127 and the driving voltage lines 172 which are overlapped form storage capacitors Cst.

In this way, the channel of the switching thin film transistor Qs is formed in the amorphous silicon such that leakage current is reduced and a reduction of the data voltage may be prevented, and the channel of the driving thin film transistor Qdd is formed in the polysilicon such that improved carrier mobility and stability may be obtained. Accordingly, the current amount of the light-emitting device may be increased to thereby improve the luminance.

In the OLED display according to the present exemplary embodiment, the switching thin film transistor Qs may be manufactured with the same method as the thin film transistor Qp of the display unit of the previous exemplary embodiment, and the driving thin film transistor Qdd may be manufactured with the same method as the thin film transistor Qd of the driving unit of the previous exemplary embodiment, and here, the description of the manufacturing method is omitted.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor comprising:
   a control electrode;
   a first semiconductor disposed on the control electrode, the first semiconductor including polycrystalline silicon;
   a second semiconductor disposed on the first semiconductor, the second semiconductor including amorphous silicon; and
   an input electrode and an output electrode disposed on the second semiconductor, the input electrode and the output electrode disposed opposite to each other.

2. The thin film transistor of claim 1, wherein the width of the first semiconductor is equal to or less than the width of the control electrode.

3. The thin film transistor of claim 2, wherein the thickness of the first semiconductor is in the range of about 100 Å to about 700 Å.

4. The thin film transistor of claim 2, wherein the second semiconductor includes
   a first portion disposed between the input electrode and the output electrode, and
   a second portion disposed under at least one of the input electrode and the output electrode,
   wherein the first portion is thinner than the second portion.

5. The thin film transistor of claim 2, wherein the thin film transistor is disposed in at least one of a gate driver and a data driver.

6. A display device comprising:
   a first thin film transistor including a first control electrode, a first semiconductor disposed on the first control electrode, and a first input electrode and a first output electrode opposite to the first input electrode, the first input electrode and the first output electrode disposed on the first semiconductor; and
   a second thin film transistor including a second control electrode, a second semiconductor disposed on the second control electrode, and a second input electrode and a second output electrode opposite to the second input electrode, the second input electrode and the second output electrode disposed on the second semiconductor,
   wherein the first semiconductor includes
   a first lower semiconductor including polycrystalline silicon, and a first upper semiconductor disposed on the first lower semiconductor, the first upper semiconductor including amorphous silicon.

7. The display device of claim 6, wherein the width of the first lower semiconductor is equal to or less than the width of the first control electrode.

8. The display device of claim 7, wherein the first upper semiconductor includes
a first portion disposed between the first input electrode and the first output electrode, and
a second portion disposed under at least one of the first input electrode and the first output electrode,
wherein the first portion is thinner than the second portion.

9. The display device of claim 8, wherein the second semiconductor includes
a second lower semiconductor overlapping the second control electrode, the second lower semiconductor including amorphous silicon, and
a second upper semiconductor disposed on the second lower semiconductor and including amorphous silicon,
wherein the width of the second lower semiconductor is equal to or less than the width of the second control electrode.

10. The display device of claim 9, wherein the second upper semiconductor includes
a third portion disposed between the second input electrode and the second output electrode, and
a fourth portion disposed under at least one of the second input electrode and the second output electrode,
wherein the third portion is thinner than the fourth portion.

11. The display device of claim 9, wherein the thickness of the first lower semiconductor and the second lower semiconductor is in the range of about 100 Å to about 700 Å.

12. The display device of claim 9, further comprising a passivation layer disposed on the first thin film transistor and the second thin film transistor,
wherein at least one of the first lower semiconductor and the second lower semiconductor is in contact with the passivation layer.

13. The display device of claim 7, wherein the first thin film transistor is disposed in a driving unit, and the second thin film transistor is disposed in a display unit, and
the driving unit includes
a gate driver connected to a first signal line, and
a data driver connected to a second signal line crossing the first signal line,
wherein the first signal line and the second signal line are connected to the second thin film transistor,
and at least one of the gate driver and the data driver is intergrated on an insulating substrate.

14. The display device of claim 7, further comprising:
a first electrode connected to the first thin film transistor;
a second electrode facing the first electrode; and
an organic emission layer disposed between the first electrode and the second electrode,
wherein the first control electrode is electrically connected to the second output electrode.

15. A method for manufacturing a display device, comprising:
forming first and second control electrodes;
forming a gate insulating layer and a first amorphous silicon layer on the first and second control electrodes;
patterning the first amorphous silicon layer to form a first lower semiconductor and a second lower semiconductor overlapping the first and second control electrodes, respectively, and having a width which is equal to or less than the width of the first and second control electrodes;
crystallizing the first lower semiconductor;
forming a second amorphous silicon layer and an ohmic contact layer on the first lower semiconductor and the second lower semiconductor;
patterning the second amorphous silicon layer and the ohmic contact layer to form a first upper semiconductor and a first ohmic contact layer disposed on the first lower semiconductor, and a second upper semiconductor and a second ohmic contact layer disposed on the second lower semiconductor;
forming a first input electrode and a first output electrode on the first ohmic contact layer, and a second input electrode and a second output electrode on the second ohmic contact layer; and
removing the first and second ohmic contact layers exposed between the first input electrode and the first output electrode, and the second input electrode and the second output electrode.

16. The method of claim 15, wherein the first lower semiconductor and the second lower semiconductor are formed through rear exposure using the first control electrode and the second control electrode, respectively, as a mask.

17. The method of claim 16, wherein the first lower semiconductor is crystallized by irradiating a laser thereon.

18. The method of claim 17, further comprising treating the first lower semiconductor with hydrogen after crystallizing the first lower semiconductor.

19. The method of claim 18, further comprising, after removing the exposed first and second ohmic contact layers,
forming an insulating layer on the first and second input electrodes and the first and second output electrodes,
forming first and second conductors connected to the first and second output electrodes, respectively, on the insulating layer, and
annealing under an atmosphere of an inert gas after forming the insulating layer or forming the first and second conductors.

20. The method of claim 16, wherein:
a first thin film transistor includes the first control electrode, the first lower semiconductor, the first upper semiconductor, the first ohmic contact layer, the first input electrode and the first output electrode;
a second thin film transistor includes the second control electrode, the second lower semiconductor, the second upper semiconductor, the second ohmic contact layer, the second input electrode and the second output electrode;
the first thin film transistor is disposed in a driving unit; and
the second thin film transistor is disposed in a display unit.

21. The method of claim 16, further comprising:
forming a first electrode connected to the first output electrode;
forming an organic emission layer on the first electrode; and
forming a second electrode on the organic emission layer.

* * * * *